(12) United States Patent
Larsson et al.

(10) Patent No.: US 11,240,945 B2
(45) Date of Patent: Feb. 1, 2022

(54) SHIELDING ARRANGEMENT FOR HIGH VOLTAGE EQUIPMENT

(71) Applicant: Hitachi Energy Switzerland AG, Baden (CH)

(72) Inventors: Mats Larsson, Västerås (SE); Dong Wu, Ludvika (SE); Liliana Arevalo, Ludvika (SE); Christer Tornkvist, Strömsholm (SE)

(73) Assignee: Hitachi Energy Switzerland AG, Baden (CH)

( * ) Notice: Subject to any disclaimer, the term of this patent is extended or adjusted under 35 U.S.C. 154(b) by 0 days.

(21) Appl. No.: 17/278,180

(22) PCT Filed: Sep. 27, 2018

(86) PCT No.: PCT/EP2018/076324
§ 371 (c)(1),
(2) Date: Mar. 19, 2021

(87) PCT Pub. No.: WO2020/064113
PCT Pub. Date: Apr. 2, 2020

(65) Prior Publication Data
US 2021/0315135 A1 Oct. 7, 2021

(51) Int. Cl.
*H05K 9/00* (2006.01)
*H02B 1/14* (2006.01)
(Continued)

(52) U.S. Cl.
CPC .............. *H05K 9/002* (2013.01); *H01B 5/004* (2013.01); *H02B 1/14* (2013.01); *H02B 7/06* (2013.01); *H02B 11/26* (2013.01); *H02M 1/00* (2013.01)

(58) Field of Classification Search
CPC .......... H05K 9/002; H01B 5/004; H02B 1/14; H02B 7/06; H02B 11/26; H02M 1/00; H02H 9/02
See application file for complete search history.

(56) References Cited

U.S. PATENT DOCUMENTS 3,209,213 A * 9/1965 Pakala .................... H01L 25/03
257/659
3,586,959 A * 6/1971 Eccles ................... H02M 1/092
257/714

(Continued)

FOREIGN PATENT DOCUMENTS

EP 2133970 A1 12/2009
JP 2004023913 A * 1/2004

(Continued)

OTHER PUBLICATIONS

Wu, Dong, et al., "The effects of a series connected resistor on the positive SI breakdown voltage of large air gaps"; SCD1 Colloquium; Trends in Technology, Materials, Testing and Diagnostics Applied to Electric Power Systems; Rio de Janeiro, Brazil; Sep. 13-18, 2015; 6 pages.

*Primary Examiner* — Robert J Hoffberg
(74) *Attorney, Agent, or Firm* — Slater Matsil, LLP

(57) ABSTRACT

A shielding arrangement can be provided for a piece of high voltage equipment spaced from a neighboring object. The piece of high voltage equipment has a first electric potential and the neighboring object has a second electric potential. The shielding arrangement includes a resistor, a shield element for connection to the high voltage equipment via the resistor, and a capacitor connected in parallel with the resistor. A resistance of the resistor and a capacitance of the capacitor together define a time constant in a range of 10 μs-50 ms.

20 Claims, 1 Drawing Sheet

(51) Int. Cl.
  *H02B 7/06*   (2006.01)
  *H02B 11/26*  (2006.01)
  *H01B 5/00*   (2006.01)
  *H02M 1/00*   (2006.01)

(56) References Cited

U.S. PATENT DOCUMENTS

| | | | | |
|---|---|---|---|---|
| 5,846,302 A * | 12/1998 | Putro | ........................ | B03C 3/66 |
| | | | | 96/66 |
| 8,525,032 B2 * | 9/2013 | Maxwell | ................ | H01B 17/44 |
| | | | | 174/127 |
| 10,064,260 B2 * | 8/2018 | Sandin | .................... | H01L 23/00 |
| 10,243,452 B2 * | 3/2019 | Wu | ...................... | H05K 7/1432 |
| 2009/0266605 A1 | 10/2009 | Ming et al. | | |

FOREIGN PATENT DOCUMENTS

| | | | | |
|---|---|---|---|---|
| WO | 2009150100 A1 | 12/2009 | | |
| WO | 2016066187 A1 | 5/2016 | | |
| WO | WO-2018177515 A1 * | 10/2018 | ........... | H05K 7/1432 |
| WO | 2020064114 A1 | 4/2020 | | |
| WO | WO-2021023369 A1 * | 2/2021 | .............. | H02M 1/44 |

* cited by examiner

SHIELDING ARRANGEMENT FOR HIGH VOLTAGE EQUIPMENT

CROSS-REFERENCE TO RELATED APPLICATIONS

This application is a national stage application of International Application No. PCT/EP2018/076324, filed on Sep. 27, 2018, which application is hereby incorporated herein by reference.

FIELD OF INVENTION

The present invention relates to a shielding arrangement for a piece of high voltage equipment as well as to a converter station comprising a converter and such a shielding arrangement.

BACKGROUND

Electrical power transmission can be accomplished by high-voltage direct current (HVDC) and HVDC is in many cases a preferred option over AC transmission.

In electrical plants there may exist a need for performing a conversion from HVDC to three-phase AC, and vice versa. A HVDC power converter comprises a number of valves, which are key components of a converter station, and the valves are typically accommodated in a valve hall.

When designing a valve hall several considerations have to be taken into account. The security aspects are very important and require the valve hall to have some minimum space dimensions. For example, the air clearance between a power converter and the walls and ceiling of the valve hall within which it resides should in some cases be up to about ten meters and in others only a few meters. The dimensions of the valve hall are highly dependent on the voltage levels of the electrical power distribution network. The higher the voltage, the more distance to the surroundings is generally needed.

The dimensions of the valve hall are determined by the intended application, the design of the valve structure and the adjacent structures, among other factors.

However, in contrast to this, there is also a desire for the valve halls to be as small as possible. Land space is often scarce and expensive and there is therefore a desire to keep the size of the valve halls down. Further, different countries stipulate different regulations and in some countries building permits may be difficult to obtain. Further yet, also aesthetic aspects make it more desirable to provide small and compact sub-stations, so that they affect the environment to as little extent as possible. The investment and installation costs, including for example material costs and labor costs, may in some countries be high and thus further yet adds to the desire to minimize the size the valve hall.

The reliability, security and safety in a high voltage application such as a power converter is of great concern. Hazards in connection with power transformers comprise for example electric discharges; power failures due to high-intensity electric arcs may black out very large areas and are expensive for the power companies. Protection measures, either passive or active, are therefore crucially important.

Some measures have been made in improving the high voltage assemblies for instance with a view to increasing security and enabling designing valve halls of smaller size, without lessening the reliability requirements.

Some of these measures may be based on the use of shielding arrangements. Shields or screens have the function of smoothing out the electrical field around the equipment. Thereby, shields reduce the risk of corona discharges as well as the risk of electrical breakdown of the equipment.

Instead of connecting the screen directly to the HV equipment, as commonly done, one initiative is described in US 2009/0266605, where a screen design is used having a resistor connected between a valve and a corresponding screen. The use of a resistor that is inhibiting electrical breakdown increases the withstand voltage of the valve.

However, there is a need for further improvement, especially with regard to improving the withstand voltage even further. In a realization of a design there are restrictions of how large the resistor can be made. If its resistance is too large a breakdown of the resistor may occur due to increased stress at corona or streamer discharges. It is therefore of interest to further increase the withstand voltage of the valve without increasing the size as well as resistance of the resistor.

SUMMARY OF THE INVENTION

One object of the present invention is therefore to increase the withstand voltage of the piece of high voltage equipment without increasing the size of a used resistor.

This object is according to a first aspect achieved through a shielding arrangement for a piece of high voltage equipment spaced from a neighboring object, where the piece of high voltage equipment has a first electric potential and the neighboring object has a second electric potential The shielding arrangement comprising a first shield element for connection to the high voltage equipment via a resistor.

The shielding arrangement further comprising a capacitor connected in parallel with the resistor, wherein the resistance of the resistor and capacitance of the capacitor together define a time constant t in a range of 10 μs-50 ms, which time constant t corresponds to RC.

The object is according to a second aspect also achieved through a converter station comprising a converter for converting between alternating current and direct current and being enclosed in an enclosure. The converter comprises a number of converter valves, where at least one is provided with a shielding arrangement according to the first aspect and where the valve has a first electric potential and the enclosure is the neighboring object having the second electric potential.

Through the use of suitably selected resistor and capacitor values, the supply of electric charges to a corona or streamer discharge is restricted by the two components. This has the effect of increasing the withstand voltage.

The invention has a number of advantages. It achieves an increase in the withstand voltage of the piece of high voltage equipment without increasing the physical size of the used resistor. Thereby the space surrounding the high voltage equipment may be more efficiently used. Thereby a distance between the piece of high voltage equipment and the neighbouring object may also be further reduced.

BRIEF DESCRIPTION OF THE DRAWINGS

The present invention will in the following be described with reference being made to the accompanying drawings, where FIG. 1 schematically shows a grounded enclosure in the form of a valve hall comprising high voltage equipment in the form of a converter, and FIG. 2 schematically shows a valve of the converter being shielded by a shielding arrangement according to a first embodiment.

DETAILED DESCRIPTION OF THE INVENTION

The present invention concerns high voltage equipment in high power applications. The high voltage equipment may be a High Voltage Direct Current (HVDC) equipment operating at a high voltage such as at 320 kV and above. The equipment may furthermore be enclosed in an enclosure that has a different electric potential than the voltage at which the piece of equipment operates. It is for instance possible that the enclosure is grounded while the piece of equipment may operate at a voltage level of +1500 kV or −1500 kV or some high voltage there between. Other feasible voltage levels are ±800 kV. The equipment may for instance be a converter, converting between AC and DC such as a current source converter (CSC) or a voltage source converter (VSC). Moreover, a voltage source converter may be provided as a modular multilevel converter (MMC), where a number of cascaded converter submodules are used for forming an AC waveshape.

Figure 1:
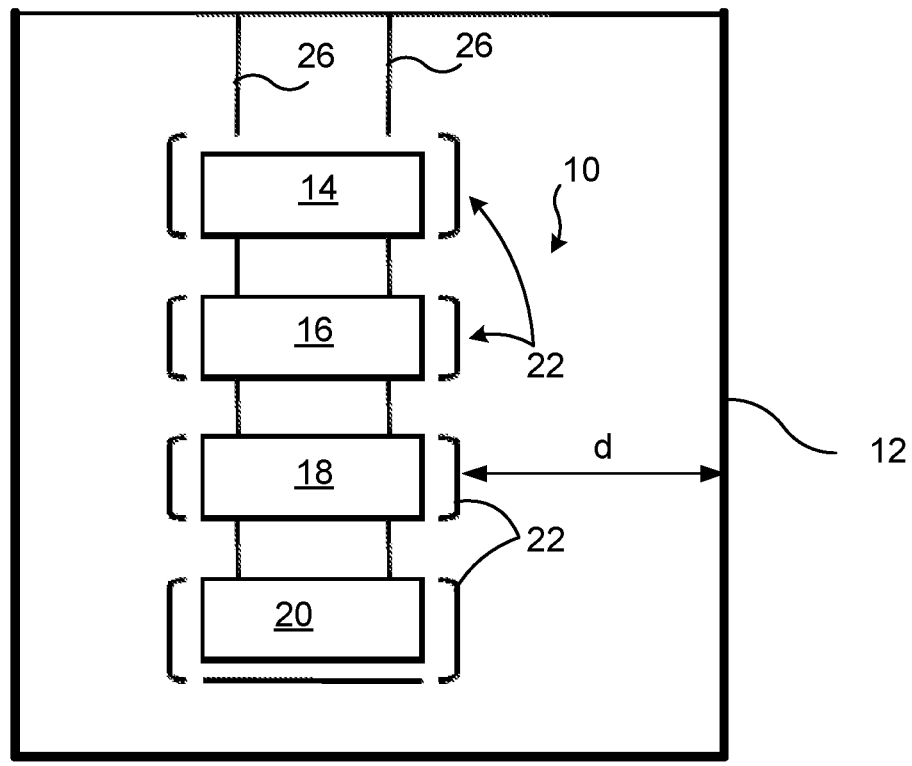

FIG. 1 schematically shows one such exemplifying HVDC converter 10 enclosed in an enclosure 12, which enclosure in this case is a building in the form of a valve hall comprising grounded walls, i.e. walls having an electric zero potential. The enclosure is one example of an object close to at least one piece of the high voltage equipment.

The converter 10 comprises a number of valves. In the example given in FIG. 1 the HVDC converter 10 is illustrated as comprising four valves 14, 16, 18 and 20. As an example, the valves may be installed hanging from the valve hall ceiling and fixed to the ceiling via suspending insulators 26. It should be realized that the way that the valves are being placed in the enclosure is not central and that they may as an exemplifying alternative be placed on a supporting structure on the valve floor.

There is also a shield structure comprising a plurality of shielding arrangements 22 for providing shielding against corona discharges. The shielding arrangements are provided for covering exposed surfaces of the valves in order to avoid possible corona discharges or electrical breakdown between the enclosure 12 and the valves 14, 16, 18 and 20. The exemplifying HVDC valves 14, 16, 18 and 20 shown in FIG. 1 comprise in total nine sides with exposed surfaces being protected by shielding arrangements 22, eight lateral sides facing each other at opposing surfaces and one lower side facing away from the ceiling.

Each such exposed surface is thus protected by a shielding arrangement against corona discharges and electrical breakdown from the valve to the enclosure, such as to a wall or to the floor. In the figure also the distance d between one such shielding arrangement 22 and the wall 12 is indicated.

Each of the valves 14, 16, 18 and 20 may be made up of a number of series-connected switches, or as a number of cascaded submodules, where such a switch may be made up of a switching element like an Insulated Gate Bipolar Transistor (IGBT) or Integrated Gate-Commutated Thyristor (IGCT) with anti-parallel diode. A submodule may be realized as one or two strings of switches, where each string is connected in parallel with an energy storages element such as a capacitor or a battery. Alternatively, the valve may be a thyristor valve.

Moreover, the voltage at which a valve operates, for instance the DC level of the valve, may be considerable.

Also, overvoltages due to lightning strikes and switching events in the system are critical for the insulation. At least one of the outermost valves 14 and 20 at each end of the structure may thus have a considerable voltage potential difference between itself and the enclosure.

The shielding arrangements 22 comprise shield elements in the form of screens at a distance from the valve element. A screen may also have a shape that stretches around any edges or corners of the physical valve shape.

Such screens may be necessary in order to protect a part of the converter 10, such as a valve, from any corona discharge and electrical breakdown from the HV part to the enclosure. Also, there is a stray capacitance between the valve and the enclosure needed to be considered As stated earlier, the voltages are high and therefore the distance d between the screen arrangement 22 and the enclosure 12 normally has to be long in order to safeguard that no corona discharges or electrical breakdown occurs.

Aspects of the present invention are directed towards providing a screen arrangement that allows smaller distances d between the arrangement and the wall and thus allows a reduction of the size of the enclosure.

One way of reducing the distance is through the shielding arrangement comprising a breakdown inhibiting resistance, for instance in the form of a breakdown inhibiting resistor. A breakdown inhibiting resistor acts as a current limiting device during a corona or streamer discharge. As a result, the voltage withstand level of the valve arrangement is increased which in turn allows a more compact design. Through the use of such a resistor the surge impulse breakdown strength of the shielding arrangement may be increased. Further, increased DC withstand levels can also be accomplished. Improved safety in an HVDC valve hall can thereby be provided, without increasing the size of the valve hall within which the valves are accommodated. Thereby also the operation reliability of the valve can be greatly improved.

However, it is of interest to raise the voltage withstand level even further in order to obtain further size reduction.

Figure 2:
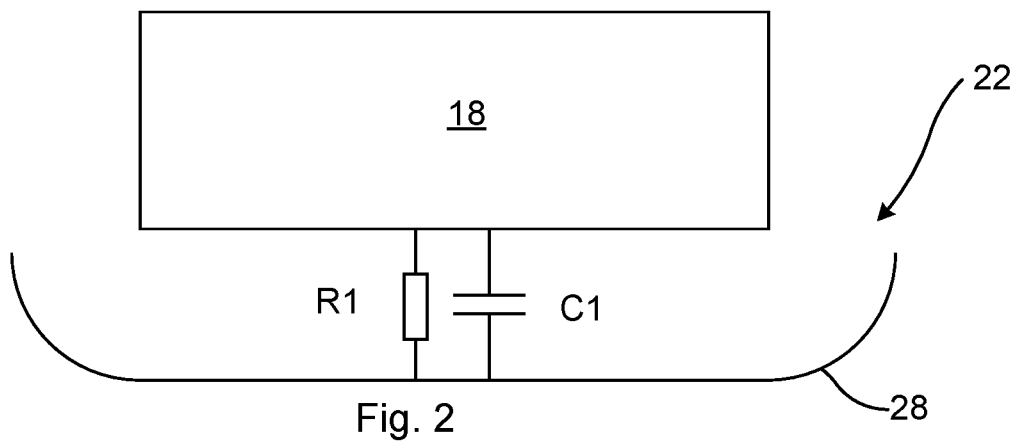

A first embodiment of a shielding arrangement 22 that addresses this problem is shown in FIG. 2.

It can be seen that the shielding arrangement 22 comprises a first shield element or screen 28 adjacent and in electrical contact with the valve 18 via a parallel connection of a resistor R1 and a capacitor C1, where the resistor is a breakdown inhibiting resistor.

The resistance of the resistor R1 may be set in the range 0.1-12 MΩ, with advantage in the range 0.2-4 MΩ, and preferably in the range 0.5-3 MΩ.

The capacitor C1 may in turn have a capacitance in the range 0.1-10 nF, which is a value for which the stray capacitance between the screen and the enclosure wall is not dominant.

The resistor and capacitor may be formed as separate components. As is well known a capacitor has two plates separated by a gap. Thereby the resistor is also separated from this gap.

Furthermore, the capacitance and the resistance form a time constant t corresponding to how fast the capacitor C1 is discharged. The time constant t, may be in a range of 10 μs-50 ms, with advantage 0.1-15 ms and preferably 0.5-5 ms. The time constant t corresponds to or is proportional to RC, where R is the resistance of the resistor R1 and C is the capacitance of the capacitor C1.

It can also be seen that in case the valve 18 comprises a corner, for instance between a vertical and horizontal surface, then the first shield element may comprise a curved section for shielding and covering this corner.

The suggested screen design with resistor and capacitor would enable significant reduction of the cost of large HVDC installations such as valve and DC halls.

Moreover, the screen design including the breakdown inhibiting resistor and capacitor aims at reducing the air clearance d between a valve and the valve hall wall, which allows the footprint and the cost of the buildings to be reduced.

Through the use of a breakdown inhibiting resistor and capacitor a high withstand voltage is obtained.

With a high withstand voltage, the distance to ground can be kept low which will directly impact the size of the building.

The functionality of the resistor when connected between a valve and a single screen is briefly described here:

Under normal conditions and without any electrical discharge, the screen takes the same potential as the HV part, i.e. as the valve to which it is connected via the resistor. The screen will therefore act as any ordinary HV screen. As soon as a corona discharge occurs at the outer HV screen, the current drawn by the discharge is limited by the resistor which frustrates the discharge. This can result in as much as 35% higher withstand level which in theory would reduce the needed clearances tremendously. It is possible that in a practical situation the voltage withstand level increase is limited to 5-10%. However, it should be noted that a 5-10% increment of the withstand level would reduce the clearances significantly more than 5-10% due to the non-linear behavior of the withstand level and gap length at high voltages.

Moreover, the larger the resistance is, the better the withstand voltage increase in principle gets. A large resistor will however create a large voltage drop between its terminations, i.e. between the HV device and the screen, and this large voltage drop may result in a breakdown over the resistor. It is therefore of interest to obtain a high withstand voltage with a limited size voltage drop over the resistor R1.

The resistor thus conducts sufficiently well to make sure that the screen and the valve are at the same potential during normal operation. The potential of the screen follows the HV equipment when any overvoltage occurs in the system, if there are no discharge events in the air close to the screen. In normal service, the resistor and capacitor are not stressed by either current or electric field and should not significantly influence the function of the high voltage equipment, due to the selected values of capacitance and resistor.

When any discharges occur at the high voltage screen, the capacitor will consume charges and reduce available charges supplied into the corona or streamer discharge. Due to shunting charges to the capacitor, the supply of charges to the corona or streamer discharge growth will be restricted and inhibit the discharge to further develop. As it turns out, a higher voltage will be needed in order to induce a spark over from the screen to ground, which is equivalent to increasing the withstand voltage.

The combination of a resistor and a capacitor of suitable chosen values thus creates a compact breakdown inhibiting device with a higher withstand voltage without increasing the size of the resistor. The resistance and capacitance may thus be selected such that the supply of electric charges to a corona or streamer discharge is restricted by the resistor and capacitor.

The arrangement can be fitted into an existing space inside the screen in many already existing designs, although the volume available is restricted.

The invention has a number of advantages. It allows the footprint and cost of high voltage equipment such as HVDC installations to be reduced. By reducing the needed air clearance for insulation, significantly advances can be made.

The neighboring object was above exemplified by an enclosure in the form of a valve hall. It should be realized that the neighboring object is in no way limited to such an object. In fact the neighboring object does not have to be an enclosure but can be separate object close to a part of the high voltage equipment. Such a neighboring object may as an example be provided outdoors.

From the foregoing discussion it is evident that the present invention can be varied in a multitude of ways.

It shall consequently be realized that the present invention is only to be limited by the following claims.

The invention claimed is:

1. A shielding arrangement for a piece of high voltage equipment spaced from a neighboring object, wherein the piece of high voltage equipment has a first electric potential and the neighboring object has a second electric potential, the shielding arrangement comprising:
   a resistor;
   a shield element for connection to the piece of high voltage equipment via the resistor; and
   a capacitor connected in parallel with the resistor, wherein a resistance of the resistor and a capacitance of the capacitor together define a time constant in a range of 10 μs-50 ms.

2. The shielding arrangement according to claim 1, wherein the time constant is in the range 0.1-15 ms.

3. The shielding arrangement according to claim 1, wherein the resistance of the resistor is in the range 0.1-12 MΩ.

4. The shielding arrangement according to claim 1, wherein the capacitance of the capacitor is in the range 0.1-10 nF.

5. The shielding arrangement according to claim 1, wherein the shield element comprises a curved section covering a corner of the piece of high voltage equipment.

6. The shielding arrangement according to claim 1, wherein the first electric potential is an operating potential of the piece of high voltage equipment and the second electric potential is a ground potential.

7. The shielding arrangement according to claim 1, wherein the neighboring object is an enclosure enclosing the piece of high voltage equipment.

8. The shielding arrangement according to claim 1, wherein the capacitor has two plates separated by a gap and wherein the resistor is separated from the gap.

9. The shielding arrangement according to claim 1, wherein the resistor and the capacitor are separate components.

10. The shielding arrangement according to claim 1, wherein the resistance and the capacitance have been selected such that a supply of electric charges to a corona or streamer discharge is restricted by the resistor and the capacitor.

11. A converter station comprising:
    a converter configured to convert between an alternating current and a direct current, the converter comprising a plurality of converter valves having a first electric potential;
    an enclosure enclosing the converter, the enclosure having a second electric potential; and
    a shielding arrangement located between the enclosure and at least one converter valve of the converter valves, the shielding arrangement comprising a shield element connected to the at least one converter valve via a resistor and a capacitor that are connected in parallel, wherein a resistance of the resistor and a capacitance of the capacitor together define a time constant in a range of 10 µs-50 ms.

12. The converter station according to claim 11, wherein the time constant is in the range 0.1-15 ms.

13. The converter station according to claim 11, wherein the resistance of the resistor is in the range 0.1-12 MΩ.

14. The converter station according to claim 11, wherein the capacitance of the capacitor is in the range 0.1-10 nF.

15. The converter station according to claim 11, wherein the time constant is in the range 0.1-15 ms, wherein the resistance of the resistor is in the range 0.1-12 MΩ, and wherein the capacitance of the capacitor is in the range 0.1-10 nF.

16. The converter station according to claim 11, wherein the shield element comprises a curved section covering the at least one converter valve of the plurality of converter valves.

17. The converter station according to claim 11, wherein the first electric potential is an operating potential of the converter valves and the second electric potential is a ground potential.

18. The converter station according to claim 11, wherein the capacitor has two plates separated by a gap and wherein the resistor is separated from the gap.

19. The converter station according to claim 11, wherein the resistor and the capacitor are separate components.

20. The converter station according to claim 11, wherein the resistance and the capacitance have been selected such that a supply of electric charges to a corona or streamer discharge is restricted by the resistor and the capacitor.

* * * * *